(12) United States Patent
Langenthal et al.

(10) Patent No.: US 6,376,054 B1
(45) Date of Patent: Apr. 23, 2002

(54) SURFACE METALLIZATION STRUCTURE FOR MULTIPLE CHIP TEST AND BURN-IN

(75) Inventors: Scott I. Langenthal, Hyde Park; Thomas E. Lombardi, Poughkeepsie; Richard Francis Indyk, Wappingers Falls; John Ulrich Knickerbocker, Hopewell Junction; Srinivasa S. N. Reddy, Lagrangeville; Richard A. Shelleman, Poughkeepsie; Rao V. Vallabhaneni, Wappingers Falls; Donald Rene Wall, Poughkeepsie, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/249,985

(22) Filed: Feb. 10, 1999

(51) Int. Cl.[7] .................................................. B32B 3/00
(52) U.S. Cl. .................... 428/210; 428/209; 174/257; 174/262; 174/263
(58) Field of Search .................. 174/262, 257, 174/263; 428/209, 210

(56) References Cited

U.S. PATENT DOCUMENTS

| | | | | |
|---|---|---|---|---|
| 4,070,518 A | * | 1/1978 | Hoffman | 428/210 |
| 4,090,009 A | * | 5/1978 | Horowitz | 428/210 |
| 4,340,618 A | * | 7/1982 | Fury et al. | 427/96 |
| 4,493,856 A | * | 1/1985 | Kumar et al. | 427/266 |
| 4,808,770 A | * | 2/1989 | Prabhu et al. | 252/512 |
| 4,964,948 A | * | 10/1990 | Reed | 156/659 |
| 5,007,163 A | | 4/1991 | Pope et al. | 29/840 |
| 5,015,314 A | * | 5/1991 | Suzuki et al. | 156/89 |
| 5,082,804 A | * | 1/1992 | Prabhu et al. | 501/19 |
| 5,086,558 A | | 2/1992 | Grube et al. | 29/832 |
| 5,167,913 A | * | 12/1992 | Acocella et al. | 419/10 |
| 5,207,585 A | | 5/1993 | Byrnes et al. | 439/66 |
| 5,260,519 A | * | 11/1993 | Knickerbocker et al. | 174/262 |
| 5,261,156 A | | 11/1993 | Mase et al. | 29/832 |
| 5,290,375 A | * | 3/1994 | Nagasaka et al. | 427/126.2 |
| 5,374,893 A | | 12/1994 | Koopman et al. | 324/754 |
| RE34,982 E | * | 6/1995 | Prabhu et al. | 428/210 |
| 5,422,190 A | * | 6/1995 | Alexander | 428/552 |
| 5,447,264 A | | 9/1995 | Koopman et al. | 28/563 |
| 5,468,655 A | | 11/1995 | Greer | 437/8 |
| 5,487,999 A | | 1/1996 | Farnworth | 437/7 |
| 5,525,402 A | * | 6/1996 | Nakamura et al. | 428/210 |
| 5,532,612 A | | 7/1996 | Liang | 324/760 |
| 5,541,524 A | | 7/1996 | Tuckerman et al. | 324/754 |
| 5,571,027 A | | 11/1996 | Roebuck et al. | 439/264 |
| 5,578,934 A | | 11/1996 | Wood et al. | 324/758 |
| 5,635,301 A | * | 6/1997 | Kondo et al. | 428/426 |
| 5,698,015 A | * | 12/1997 | Mohri et al. | 428/210 |
| 5,787,578 A | * | 8/1998 | Farooq et al. | 29/843 |
| 5,925,443 A | * | 7/1999 | Aoude et al. | 428/209 |

* cited by examiner

*Primary Examiner*—Cathy Lam
(74) *Attorney, Agent, or Firm*—Margaret A. Pepper

(57) ABSTRACT

A cost-effective surface metallization structure of a TCA carrier is produced by using a high-grit conducting paste to fill TSM vias in the TSM of the TCA carrier. This concept can be applied to alumina substrates with refractory metal conductors or to LCGC substrates with more noble metal conductors.

22 Claims, 4 Drawing Sheets

SURFACE METALLIZATION STRUCTURE FOR MULTIPLE CHIP TEST AND BURN-IN

FIELD OF THE INVENTION

The present invention relates to a temporary chip attach (TCA) carrier for use in an integrated circuit die testing system; and, more particularly, to a surface metallization structure of the TCA carrier which makes it possible to conduct multiple chip test and burn-in processes in a cost effective manner.

BACKGROUND OF THE INVENTION

There is a growing need in the microelectronics industry for known-good-dies (KGD's). These are semiconductor chips (or dies) that have been tested and burned-in, and are known good prior to their sale or being placed on a multi-chip module (MCM).

One common method used today to facilitate the test and burn-in of a new semiconductor chip is to mount the chip on a temporary ceramic carrier, execute the test and burn-in thereof, and then remove the die from the carrier in such a way that neither the quality of the die nor the functionality of solder balls on the die is compromised, wherein the solder balls are attached to the die that join the die to the carrier.

While it is necessary to have the chip securely mounted or electrically connected to the carrier to carry out the test and burn-in, the chip must be easily removable from the carrier without incurring any damage to the chip or the solder balls. In this way, the chips so tested can then be reflowed onto the MCM, or sold to an OEM customer as KGDs so that the tested and/or burned-in chips can be incorporated onto their substrate for final use.

A ceramic carrier used for this purpose is called TCA that stands for temporary chip attach. Certain key aspects that any successful TCA carrier should possess include: (1) proper surface metallization; (2) appropriate electrical contact with all solder balls; (3) ease of chip attachment and detachment; (4) minimal impact to the solder balls for subsequent chip reflow; (5) low cost of TCA carrier manufacture and process; (6) multiple use capability; (7) soft and hard rework capability, to name a few.

Today, there are TCA carriers available whose TCA top surface metal (TSM) contact pads are produced by a thin film process. In general, using the thin film process, a surface metal pad of a reduced area is deposited, through a complex series of steps, on a prepared TSM of a ceramic substrate and located within the circumference of an existing refractory metal via.

An exemplary via and pads of the prior art are illustrated in FIGS. 1A and 1B which respectively show a top and a cross sectional views of a portion of a TCA carrier 12 comprising a refractory metal via 14 and a surface metal pad 16. The reduced area surface metal pad 16 deposited by employing the thin film process is made of a solderable metal such as nickel (Ni). Therefore, the reduced area solderable nickel pad 16 becomes a small island of wettable contacts in a sea of non-wettable refractory metal via 14. These reduced area solderable nickel pads serve to provide a reliable electrical connection with solder balls on a chip (not shown) and also enable the chip to be subsequently cold-sheared off of the TCA carrier 12 after the completion of the test and burn-in thereof, without a significant alteration of the solder balls.

In a more detailed description of the thin film process for the manufacture of a conventional TCA carrier, a standard ceramic substrate, typically an alumina substrate, having about 5 mil vias filled with a refractory metal, e.g., molybdenum (Mo) or tungsten (W), on a TSM layer is sintered. After the sintering, the substrate is coated with polyimide, and then developed and exposed to provide a 1×2 mil opening in the polyimide over each 5 mil via. Although a nickel pad of any general shape may be produced in the thin film process, in this specific example, a rectangular shape has been used for the sake of illustration. Circles, squares, and other shapes may be equally feasible. The substrate is then placed in a Ni/B bath and the 1×2 mil opening is plated with said Ni/B. After the polyimide is stripped away, the newly deposited Ni/B pads are diffused to remove the boron (B) to establish a reliable bond between the nickel pad and the refractory metal via. The substrate is then ready for use as a TCA carrier. The solder ball on the chip wets only the small Ni area on the carrier, creating the electrical connection. The 5 mil via of, e.g., Mo circumscribing the deposited thin film nickel pad is not wetted by the solder ball of a Pb/Sn solder. In this way, the solderable area of the standard 5 mil via is reduced to about 10% of its original area.

While the conventional TCA carrier described above satisfies the key technical aspects, owing to the complex and costly thin film process employed in the manufacture thereof, there has existed a need to develop a low cost TCA carrier.

SUMMARY OF THE INVENTION

It is, therefore, a purpose of the present invention to provide a TCA carrier employing a cost-effective and improved surface metallization structure for use in performing multiple chip test and burn-in processes.

The invention relates to a surface metallization scheme wherein a novel and high grit conductive metal paste is used to fill vias in the TSM layer of a TCA carrier to produce fired vias which are comprised of metallic and non-metallic regions. This concept can be applied to standard alumina substrates with refractory metal conductors or to LCGC (low cost glass ceramic) substrates with more noble metal conductors. Depending on the substrate material used, optimal nickel plating conditions are selected to plate the metallic regions of the via with a thin layer of Ni, without bridging them to the non-metallic regions. The resulting surface metallization structure is essentially composed of islands of solderable metallic contacts surrounded by non-metallic and non-wettable regions in the via surface. The metallic contacts can be wetted by Pb/Sn solders of solder balls during chip attach. The non-metallic regions of the composite via remain unwetted, thereby producing a reduced solderable area of the via. This scheme can be combined with the idea of using a smaller via diameter for a further reduction in the solderable area.

In accordance with the present invention, there is provided a ceramic carrier for use in multiple chip test and burn-in, comprising: a substrate; a plurality of vias in the substrate; and a conductive material at least partially filling the vias, the whole top surface of the conductive material being solderable.

BRIEF DESCRIPTION OF THE DRAWINGS

The above and other purposes and features of the present invention will become apparent from the following description of preferred embodiments given in conjunction with the accompanying drawings, in which.

DETAILED DESCRIPTION OF THE PREFERRED EMBODIMENTS

The present invention describes a surface metallization scheme which enables a standard ceramic carrier to be converted into a low cost TCA carrier while satisfying all of the requirements of a successful TCA carrier. The invention involves at least four key embodiments, which can be used in conjunction with each other: first, the use of a "high grit" conductive metal paste for top surface metal (TSM) via fill; second, the reduction of the surface via diameter by using various known methods; third, dry process (DP) nickel plating of the refractory metal composite TSM via or thinner nickel plating of the TSM via by conventional methods; and fourth, the use of a low temperature glass ceramic substrate with directly solderable metallic TSM vias.

Figure 2A:
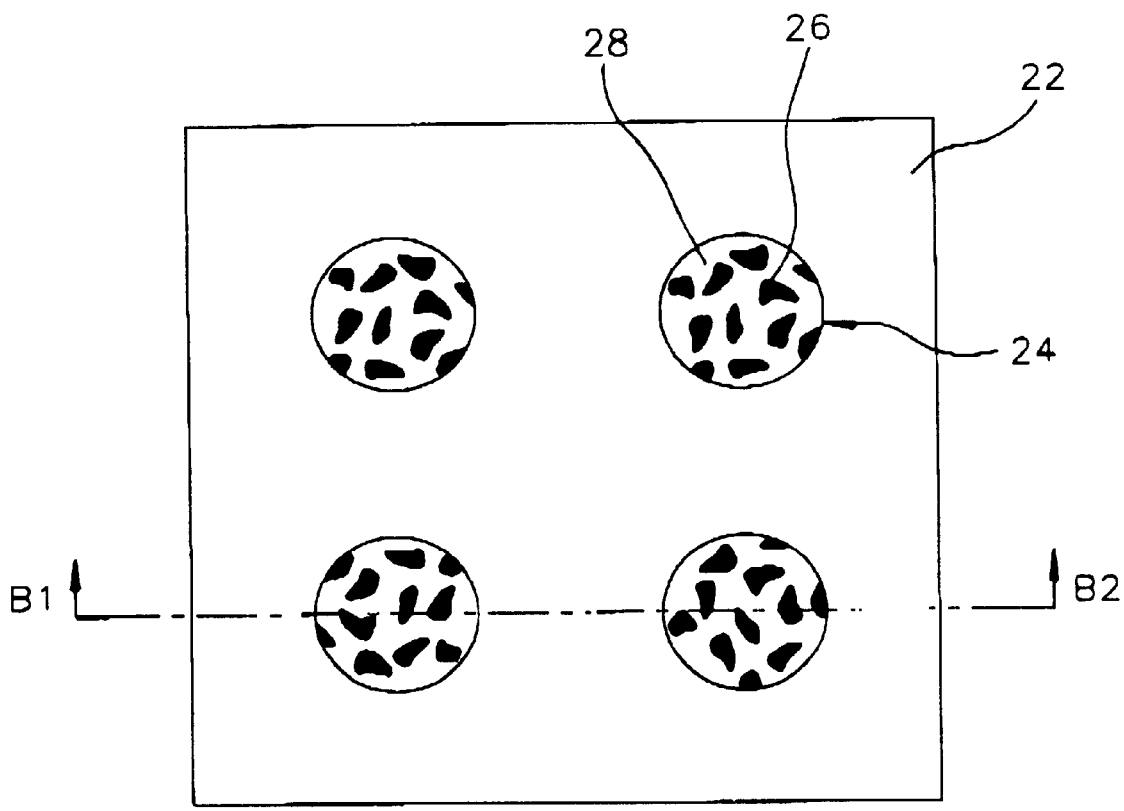
FIG. 2A represents a top view of a portion of a TCA carrier employing a metallization structure in accordance with a first embodiment of the present invention.
Figure 2B:
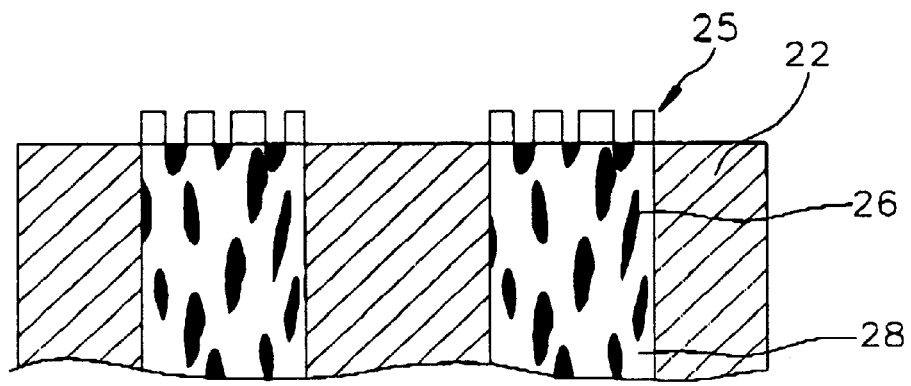
FIG. 2B offers a cross sectional view of the TCA carrier shown in FIG. 2A.

Referring to FIGS. 2A and 2B, there is shown a portion of a carrier 20, such as a TCA carrier 20 in accordance with a first embodiment of the present invention, wherein the carrier 20 includes vias 24 on a standard substrate 22, e.g., a ceramic or alumina, substrate 22, and pads 25, such as, nickel pads 25.

In order to substantially reduce the solderable area, while avoiding the complex and costly thin film process, of the vias 24, this embodiment uses a "high grit" conductive paste to fill the vias 24. This paste contains a high nonmetallic content of "grit" or frit, e.g., from about 35% to about 70% together with a non-wettable refractory metal, e.g., Mo or W. The high grit paste is screened in the vias 24 and sintered in a known standard cycle. The resulting fired vias 24 have metallic regions 28, e.g., Mo or W regions 28 and non-metallic regions 26, e.g., glass or alumina regions 26 present.

This composite structure has the effect of reducing the surface area of the vias 24 that is metallic, thereby reducing the surface area of the vias 24 that is wettable by solder balls, such as, C4 solder balls on a chip (not shown).

The key to this first embodiment of the present invention is that the use of the high grit paste for the TSM vias 24 in the standard alumina substrate 22 will produce the vias 24 that have the non-metallic and metallic regions 26 and 28 exposed after sintering.

This via structure can then be directly, i.e., without going through the thin film process, plated with a solderable metal, e.g., nickel, using the proper conditions such that the plated nickel, i.e., the nickel pads 25, does not bridge between the metallic regions in the via. That is, the nickel alone plates the metallic regions 28; and the non-metallic regions 26 are left unplated. Therefore, the resulting surface metallization structure comprises the metallic regions 28 having the nickel pads 25 thereon, blended with the non-metallic regions 26 having no nickel pads thereon.

This structure, therefore, produces vias with a reduced solderable area. When C4 balls of a die are joined to the vias, the C4 solders will wet only the nickel of the vias and will not wet the non-metallic regions thereof. Thus, electrical connection will be made between the C4 balls and the vias; however, when the die has to be removed from the TCA carrier, it can be removed easily since it is joined only to the carrier with a tenuous connection, since the vias on the carrier are predominantly non-metallic and non-wettable.

As can be seen above, this surface metallization structure, produced by using the high grit screening paste to fill the TSM vias and plating nickel thereon without employing the thin film process, effectively reduces the solderable area of the vias in a cost effective manner, which is ideal for TCA applications.

Figure 3A:
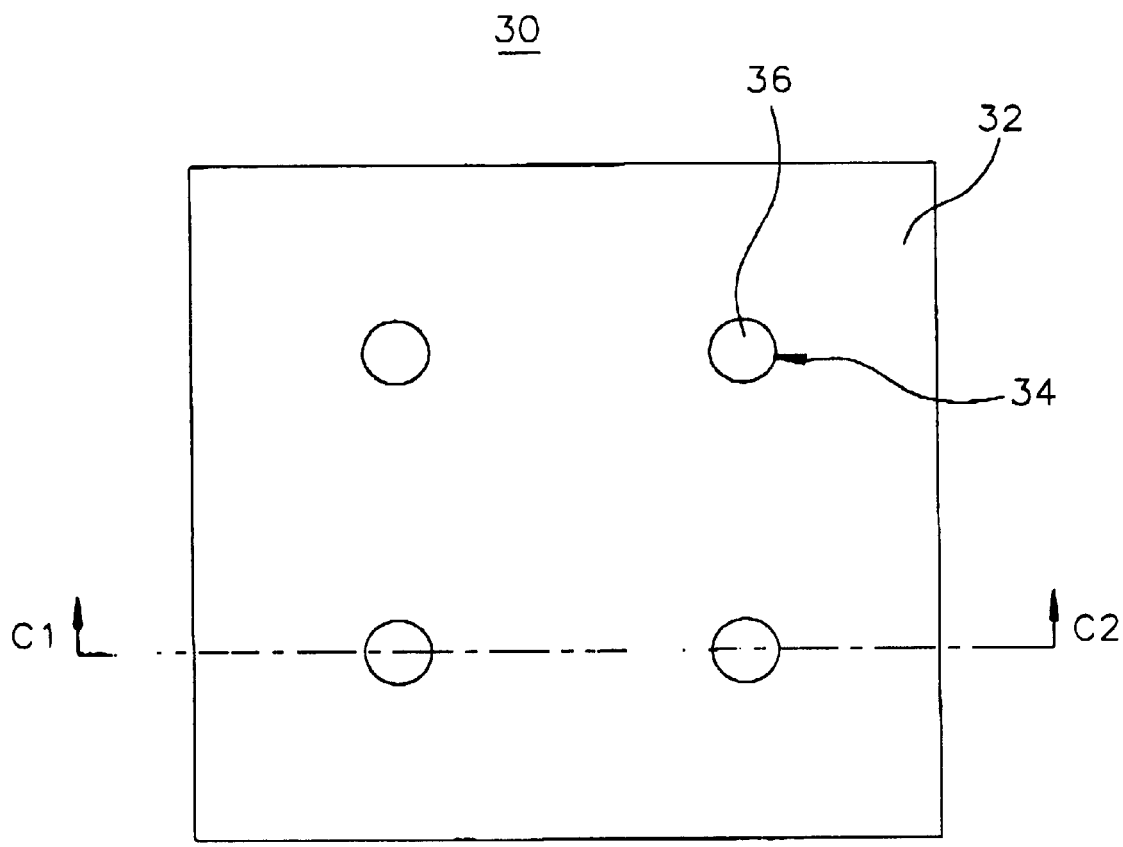
FIG. 3A presents a top view of a TCA carrier employing a metallization structure in accordance with a second embodiment of the present invention.
Figure 3B:
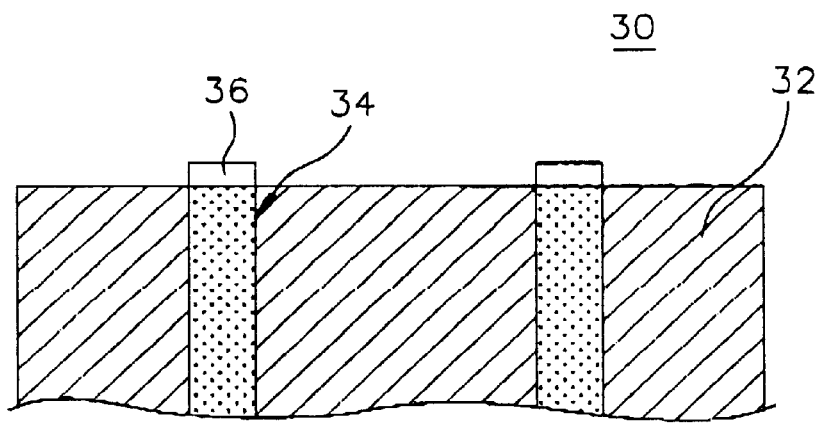
FIG. 3B illustrates a cross sectional view of the TCA carrier shown in FIG. 3A.

Referring to FIGS. 3A and 3B, there is provided a TCA carrier 30 in accordance with a second embodiment of the present invention, wherein the carrier 30 includes a ceramic substrate 32, e.g., alumina substrate 32 having vias 34 filled with a refractory metal, e.g., Mo or W, and pads 36 made of a solderable metal, e.g., Ni.

Figure 1A:
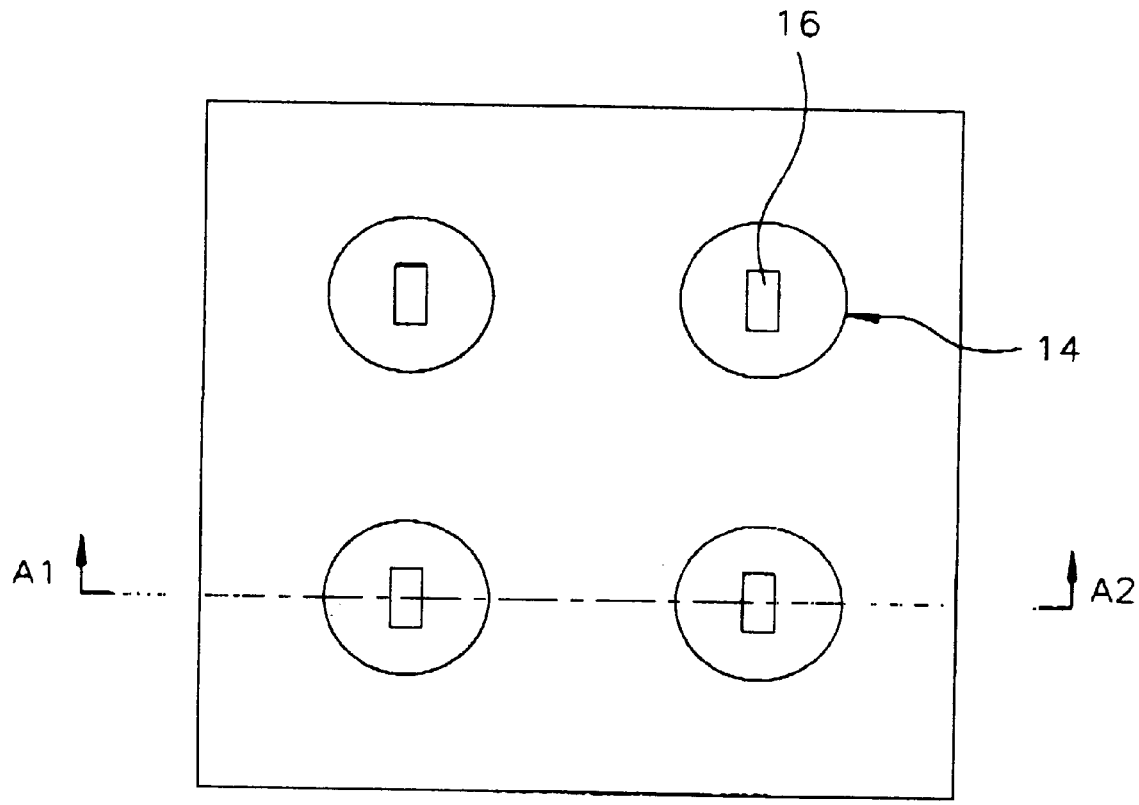
FIG. 1A depicts a top view of a portion of a conventional TCA carrier.
Figure 1B:
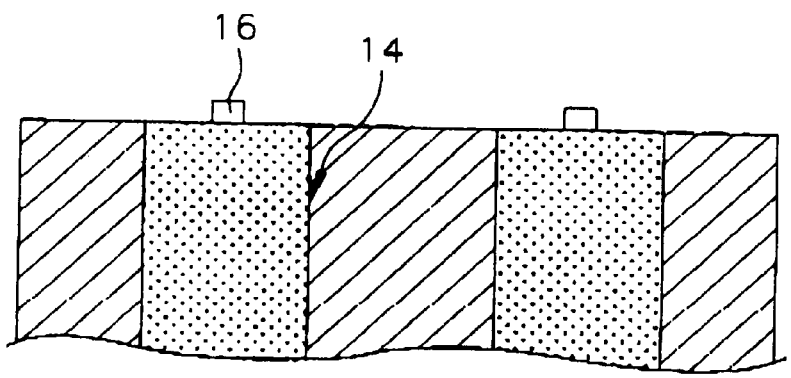
FIG. 1B shows a cross sectional view of the TCA carrier shown in FIG. 1A.

In this embodiment, smaller diameter punched vias 34 are used instead of the conventional 5 mil vias 14 as described in FIGS. 1A and 1B. The vias 34 can be mechanically punched so that each has a diameter ranging from about 2 mil to about 4 mil, e.g., 2.5, 3.0 or 3.5 mil. Alternatively, the vias 34 can be created by using an E-beam or laser, which has an approximately 2 mil diameter. The vias 34 are filled with a refractory metal, e.g., Mo or W, and the surface thereof is directly plated with a wettable metal, e.g., nickel, in the same manner as in the first embodiment of the present invention.

The reduction in the via diameter by using known methods, e.g., mechanical punching, E-beam or laser, serves to reduce the surface area of the vias that is solderable. The smaller the solderable area, the lower the force necessary to remove the chip from the TCA carrier after test and burn-in. In the illustration given in FIGS. 3A and 3B, the via is about one-half of the conventional 5 mil via, e.g., 2 mil, resulting in a reduced surface area of the via by four to six times.

Even a further reduction of the solderable area can be achieved by combining the first and the second embodiments. That is, the application of the high grit conductive paste of the first embodiment in filling the smaller diameter vias of the second embodiment can further reduce the solderable area without requiring any additional process.

In a third embodiment of the invention, a dry process (DP) nickel plating process is used in plating the composite TSM refractory metal vias. It is a high temperature dry process rather than a low temperature wet process. Typical DP Ni processing conditions may employ a temperature ranging from about 790° C. to about 840° C. with a 10–40 minute dwell time.

DP Ni plating insures that the non-metallic region of the TSM via is not plated with wettable Ni. It has been found that the DP Ni plating process is less likely than conventional Ni plating methods to bridge over non-metallic regions in a refractory metal surface. By employing the DP Ni plating process, it is possible to create a layer of Ni having about 1 to about 5 microns only on the metallic region and not on the non-metallic and does not bridge the two regions. Therefore, the purpose of the addition of grit to the via paste, that is to reduce the wettable area of the via, is preserved. Nickel plating with conventional wet processes, such as Ni/B or Ni/P, can have a similar effect if the plating thickness is significantly reduced, e.g., down to less than about 2 microns. However, that is a difficult process to control or put into manufacturing. Further, if the coating is too thin, there may occur some problems in the workability, physical characteristics, durability and/or reliability. For this reason, the DP Ni process is preferred.

The surface metallization structure described above is particularly advantageous in that it can be produced at a much reduced cost. Instead of producing a standard carrier and then going through the complex and costly thin film process to produce a reduced solderable area on the via, the present invention yields a reduced solderable area via directly from sintering, with no post-sintering thin film process required. The metallization structure is also reusable. Chips can be sheared off of the carrier substrate and most of the C4 solder balls will remain with the chips so that the chips can be joined to MCM's, etc, without incurring any problems. The remaining carrier will still be composed of islands of, e.g., Mo/Ni, and can be reused as the TCA carrier. This invention only adds one additional processing step to the carrier substrate. Since the TSM layer has to be punched anyway, the punching of a smaller via (or E-beam) adds no additional steps. Since the TSM layer has to be screened anyway, substitution of this novel high-grit paste adds no additional steps. The plating of the TSM layer using the optimized thin Ni would add only one step to plating. The TSM would be plated, using the standard DP Ni conditions, to produce a thin, non-bridging Ni surface on the high-grit TSM via.

Figure 4A:
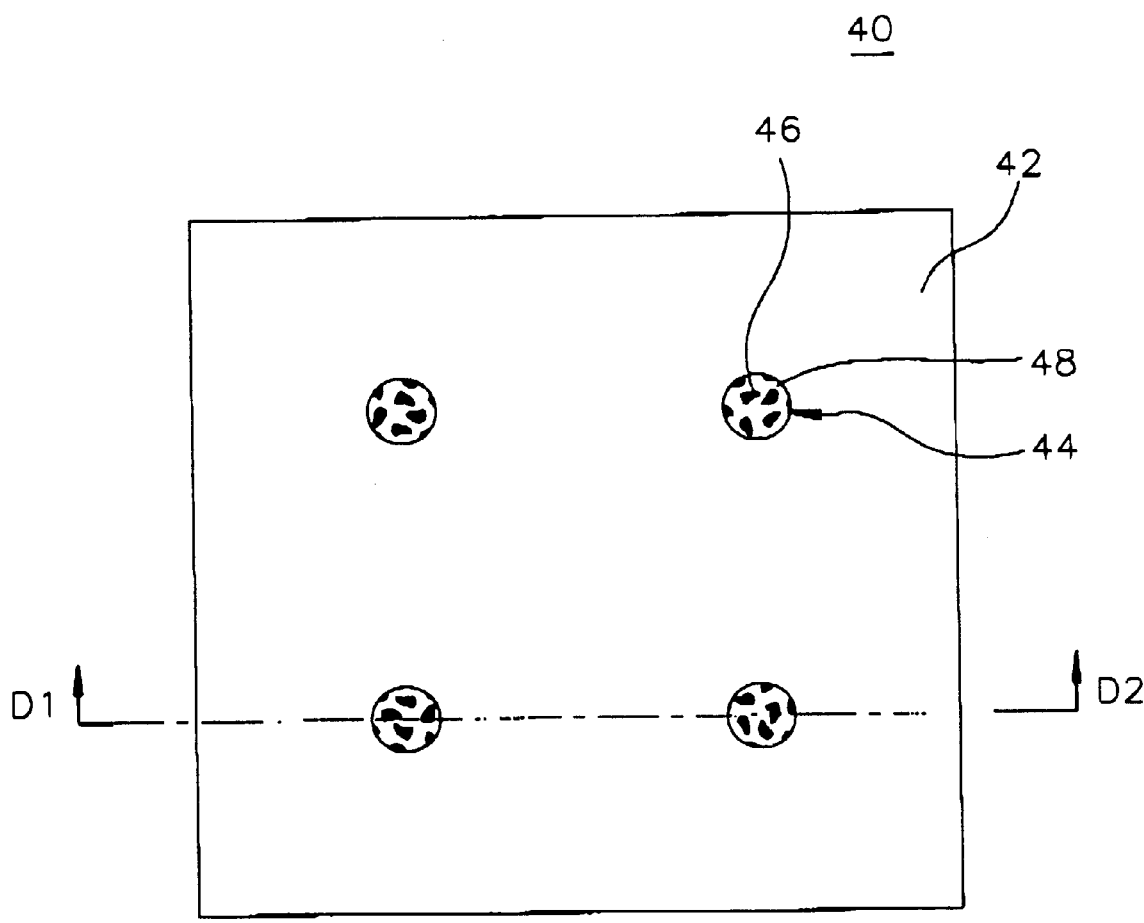
FIG. 4A describes a top view of a portion of a TCA carrier employing a metallization structure in accordance with a fourth embodiment of the present invention.
Figure 4B:
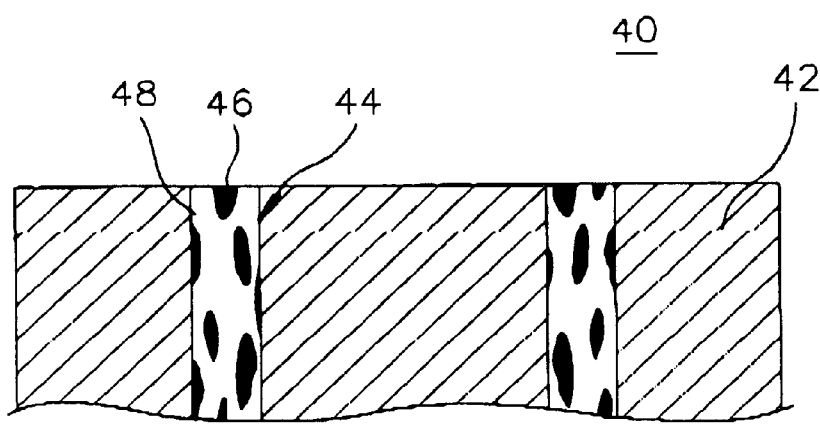
FIG. 4B provides a cross sectional view of the TCA carrier shown in FIG. 4A.

Referring to FIGS. 4A and 4B, there is shown a TCA carrier 40 in accordance with a fourth embodiment of the present invention. In this embodiment, a low cost glass ceramic (LCGC) substrate 42 is substituted for the standard alumina substrate with Mo or W metallization. In general, alumina has to be sintered at a high temperature between about 1500° C. and about 1600° C. In contrast, the LCGC substrate can achieve metallization at a temperature below about 1000° C.

In this case, the LCGC substrate is typically metallized with copper or silver for internal conductors; and a TSM layer thereof can be metallized with copper, silver, silver/palladium, nickel, copper/nickel alloy or an appropriate combination thereof. These metals or alloys have a very distinct advantage over the refractory metals such as Mo and W used to metallize the standard alumina substrate in that they are directly solderable or wettable under the "as sintered" condition. Therefore, they can, if processed under the right conditions, serve as a TCA without requiring any post-sintering preparations.

In many cases, nickel plating can be completely eliminated from the process along with several complementary steps of plating such as cleaning or diffusion steps. This results in substantial cost savings for both first time use TCA's and for the cost of reworking TCA's.

With the LCGC carrier, the TSM via fill paste can contain a nonconductive and non-wettable material (such as glass ceramic) similar to the "high grit" portion used in the TSM paste for filling top surface vias of the standard alumina TCA carrier. The resulting surface metallization structure comprises islands of Cu in the via surrounded by nonmetallic (glass) regions therein. Exemplary vias of this nature are shown in FIGS. 4A and 4B, wherein TSM vias 44 include metallic regions 48 and non-metallic regions 46. In this way, the feature of the first embodiment, i.e., the reduction of the solderable area on the alumina carrier, is equally applicable to the LCGC TCA carrier.

Another benefit that inheres in the LCGC TCA carrier is the improved electrical performance. The LCGC uses copper predominately as the carrier conductor. Copper has superior electrical conductivity to that of the refractory metals, e.g., Mo or W.

An additional benefit is the improvement in pattern distortion that can be obtained in the process of producing LCGC substrates. For instance, the conformal sintering method available for the manufacture of cordierite glass ceramic substrates has been shown to produce features with reduced distortion and better placement accuracy. This improvement in pattern distortion substantially facilitates the chip attachment and detachment. Further, it is also easier to punch the small vias in the glass ceramic substrate than in the alumina substrate, which will be the combination of the second and the fourth embodiments.

In the fourth embodiment, solderable regions are obtained without requiring the Ni plating process. Ni plating, however, may be carried out on the LCGC substrate, as in the first and the second embodiments, in order to enhance the durability of the TCA carrier. In this case, the DP Ni plating process however is not applicable but a conventional low temperature wet Ni plating process could be used to plate the copper, silver, silver/palladium, nickel, copper/nickel alloy, etc.

Still another significant advantage of the low temperature TCA carrier is in the low cost of reworking. With the alumina substrate TCA where solderability is provided through the nickel plating of refractory metal vias, reworking a substrate requires that the substrate go through the plating process again. This is the most expensive part of the alumina TCA fabrication process. However, with the LCGC substrate, where plating is not required to promote solderability, the rework process can be simple and inexpensive since only a mild polish of the TCA carrier is required to expose the virgin via material. In addition, the top layer of the carrier may even be made thicker or of multiple layers with the composite TSM via paste to improve the durability thereof.

While the present invention has been described with respect to the particular embodiments, it will be apparent to those skilled in the art that various changes and modifications may be made without departing from the spirit and scope of the invention as defined in the following claims.

What is claimed is:

1. A temporary chip attach carrier, for use in test or burn-in of an integrated circuit chip, comprising:
   a substrate having a top surface and a bottom surface;
   a plurality of vias in said substrate traversing from said top surface to said bottom surface,
      wherein said vias are filled with a material comprising a non-conductive inorganic material and a conductive material; and
   a conductive pad formed on said top surface of each of said vias, wherein said conductive pad contacts portions of said top surface of said via which contain conductive material, and does not contact portions of said top surface of said via which contain non-conductive material.

2. The temporary chip attach carrier of claim 1, wherein said substrate is formed of a ceramic material.

3. The temporary chip attach carrier of claim 1, wherein said conductive material is a non-solderable refractory metal.

4. The temporary chip attach carrier of claim 3, wherein said non-solderable refractory metal is selected from the group consisting of molybdenum and tungsten.

5. The temporary chip attach carrier of claim 1, wherein said vias are filled with a material comprising about 35 vol % to about 70 vol % of said non-conductive inorganic material.

6. The temporary chip attach carrier of claim 1, wherein said non-conductive inorganic material is selected from the group consisting of glass and alumina.

7. The temporary chip attach carrier of claim 1, wherein said conductive pad is formed of a solderable material.

8. The temporary chip attach carrier of claim 7, wherein said solderable material is nickel.

9. The temporary chip attach carrier of claim 8, wherein said conductive pad is formed by a wet nickel plating process.

10. The temporary chip attach carrier of claim 1, wherein said vias are formed by mechanical punching.

11. The temporary chip attach carrier of claim 1, wherein said vias are formed by using an E-beam or laser.

12. The temporary chip attach carrier of claim 1, wherein said vias have a diameter of about 2 mils to about 4 mils.

13. The temporary chip attach carrier of claim 8, wherein said conductive pad is formed by a dry nickel plating process.

14. The temporary chip attach carrier of claim 13, wherein said conductive pad has a thickness of about 1 micron to about 5 microns.

15. The temporary chip attach carrier of claim 1, wherein said substrate is formed of glass ceramic material.

16. The temporary chip attach carrier of claim 15, wherein said conductive material is selected from the group consisting of copper, silver, silver/palladium alloy, nickel, copper/nickel alloy, and combinations thereof.

17. The temporary chip attach carrier of claim 15, wherein said non-conductive inorganic material is glass ceramic.

18. The temporary chip attach carrier of claim 1, wherein said temporary chip attach carrier is sintered.

19. A temporary chip attach carrier, for use in test or burn-in of an integrated circuit chip, comprising:

a substrate having a top surface and a bottom surface;

a plurality of vias in said substrate traversing from said top surface to said bottom surface,
wherein said vias are filled with a material comprising a glass ceramic material and a conductive material selected from the group consisting of copper, silver, silver/palladium alloy, nickel, copper/nickel alloy, and combinations thereof; and a conductive pad formed on said top surface of each of said vias, wherein said conductive pad contacts portions of said top surface of said via which contain conductive material, and does not contact portions of said top surface of said via which contain glass ceramic material.

20. The temporary chip attach carrier of claim 19, wherein said conductive pad is formed of nickel.

21. The temporary chip attach carrier of claim 20, wherein said conductive pad is formed by a wet nickel plating process.

22. The temporary chip attach carrier of claim 19, wherein said temporary chip attach carrier is sintered.

* * * * *